(12) United States Patent
Hong

(10) Patent No.: US 6,825,129 B2
(45) Date of Patent: Nov. 30, 2004

(54) METHOD FOR MANUFACTURING MEMORY DEVICE

(75) Inventor: Kwon Hong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/153,614

(22) Filed: May 24, 2002

(65) Prior Publication Data

US 2002/0187578 A1 Dec. 12, 2002

(30) Foreign Application Priority Data

Jun. 12, 2001 (KR) ........................................ 2001-32745

(51) Int. Cl.$^7$ .......................................... H01L 21/8242
(52) U.S. Cl. ...................... 438/763; 438/387; 438/637; 438/702; 438/703
(58) Field of Search ................................ 438/253, 387, 438/396, 637, 700, 702, 703, 763, FOR 220, FOR 388, FOR 395, FOR 430

(56) References Cited

U.S. PATENT DOCUMENTS

| | | | |
|---|---|---|---|
| 5,554,866 A | 9/1996 | Nishioka et al. | |
| 5,576,928 A | 11/1996 | Summerfelt et al. | |
| 5,581,436 A | 12/1996 | Summerfelt et al. | |
| 5,589,284 A | 12/1996 | Summerfelt et al. | |
| 5,619,393 A | 4/1997 | Summerfelt et al. | |
| 5,626,906 A | 5/1997 | Summerfelt et al. | |
| 5,665,628 A | 9/1997 | Summerfelt | |
| 5,696,018 A | 12/1997 | Summerfelt et al. | |
| 5,729,054 A | 3/1998 | Summerfelt et al. | |
| 5,851,896 A | 12/1998 | Summerfelt | |
| 6,096,592 A | 8/2000 | Cho | |
| 6,144,060 A | 11/2000 | Park et al. | |
| 6,255,157 B1 * | 7/2001 | Hsu et al. | 438/239 |
| 6,294,425 B1 * | 9/2001 | Hideki | 438/253 |
| 6,358,848 B1 * | 3/2002 | Lopatin | 438/687 |
| 6,380,579 B1 * | 4/2002 | Nam et al. | 257/306 |
| 6,419,742 B1 * | 7/2002 | Kirk et al. | 117/84 |
| 6,482,733 B2 * | 11/2002 | Raaijmakers et al. | 438/633 |
| 6,518,634 B1 * | 2/2003 | Nguyen et al. | 257/406 |
| 6,518,648 B1 * | 2/2003 | Lopatin | 257/663 |
| 6,528,412 B1 * | 3/2003 | Wang et al. | 438/628 |
| 6,528,884 B1 * | 3/2003 | Lopatin et al. | 257/758 |
| 6,580,111 B2 * | 6/2003 | Kim et al. | 257/301 |
| 6,611,045 B2 * | 8/2003 | Travis et al. | 257/620 |
| 2001/0054730 A1 * | 12/2001 | Kim et al. | 257/301 |
| 2001/0055851 A1 * | 12/2001 | Horii | 438/393 |
| 2002/0009880 A1 * | 1/2002 | Jiang et al. | 438/643 |
| 2002/0076925 A1 * | 6/2002 | Marieb et al. | 438/678 |
| 2002/0149047 A1 * | 10/2002 | Divakaruni et al. | 257/302 |
| 2002/0164890 A1 * | 11/2002 | Kwan et al. | 438/763 |
| 2002/0171107 A1 * | 11/2002 | Cheng et al. | 257/347 |

FOREIGN PATENT DOCUMENTS

KR    2000-0008815 A    2/2000

* cited by examiner

Primary Examiner—George Fourson
Assistant Examiner—Joannie Adelle Garcia
(74) Attorney, Agent, or Firm—Birch, Stewart, Kolasch & Birch, LLP

(57) ABSTRACT

There is provided a method for manufacturing capacitor in a semiconductor memory device. The method for manufacturing a memory device having a dielectric layer includes the steps of forming a seed layer as a first dielectric layer by using an ALD method and forming a second dielectric layer by using a CVD method.

22 Claims, 6 Drawing Sheets

METHOD FOR MANUFACTURING MEMORY DEVICE

FIELD OF THE INVENTION

The present invention relates to a semiconductor memory device and to a method for manufacturing capacitors in a semiconductor memory device.

DESCRIPTION OF THE PRIOR ART

With increasing integration in a dynamic random access memory (DRAM), a memory cell region for storing 1 bit, which is a unit of storage in the memory device, becomes decreased. Meanwhile, an area of a capacitor may not decrease as much as that of the unit cells. This is because a capacitance charge per cell is needed to prevent soft error and to maintain an operational safety margin. Therefore, there are three methods for maintaining proper memory capacitance within a limited cell region. The first method reduces the thickness of a dielectric. The second method makes a capacitor bottom electrify with a three-dimensional structure with a large effective area. The third method uses high dielectric constant materials.

A dielectric layer capacitor has a high dielectric constant material such as $TiO_2$, $Ta_2O_5$, $ZrO_2$, $(BaSr)TiO_3$ (BST), $(PbZr)TiO_3$ (PZT), (PbLa) $(ZrTi)O_3$ (PLZT), $(PbLa)TiO_3$ (PLT), TaON, etc. Among the above-mentioned materials, the barium strontium titanate (BST) layer is expected to be a preferred high dielectric layer, which is adapted to $0.10\,\mu m$ technology. The BST dielectric layer has a high dielectric constant of about 200 to 400, and it is crystallized on a metal layer, so it has a metal-insulator-metal (MIM) structure. The metal layer, which is used as an electrode, can be any material selected from Pr, Ir, Ru, $RuO_2$ or $IrO_2$.

However, the BST layer itself is unstable, and therefore makes an etching process of a metal electrode so difficult as to cause many problems in the integration process, like deterioration caused by hydrogen. When a capacitor electrode is formed with a metal layer including a platinum layer, a barrier layer is necessarily formed. The barrier layer prevents reaction with a polysilicon plug, and prevents diffusion of oxygen, which is used as a source in depositing a dielectric layer and annealing the dielectric layer.

Also, in a stacked capacitor having three-dimensional structure corresponding to a highly integrated DRAM, producing a higher bottom electrode renders more difficult an etching process of the bottom electrode. Therefore, the conventional art utilizes a concave capacitor to avoid the difficulties associated with the etching process. According to the conventional method for manufacturing the concave capacitor, an interlayer insulating layer is formed on a portion where a bottom electrode is formed, and a storage node hole is formed within the interlayer insulating layer. After that, a platinum metal layer, which is a bottom electrode, is deposited at a predetermined thickness to form a storage electrode.

When forming the concave capacitor mentioned above, a platinum metal etching process is easily performed, and the height of a storage node may be regulated to prevent misalignment between a storage node contact and the storage node.

Also, higher integration of a concave capacitor results in increasing the height of an oxide, which is used as an interlayer insulating layer for assuring a region. As a result, dielectric materials may be formed in a deep valley of a storage node. That is, when depositing the BST layer using chemical vapor deposition (CVD) to obtain a large step coverage, the reliability of an electric characteristic of the BST layer between a surface and the valley is not guaranteed.

FIG. 1 is a cross-sectional view of a conventional concave capacitor. A first interlayer insulating layer 205 is deposited on a semiconductor substrate 200 to form a contact hole, and a plug 210 is formed by filling the contact hole with a conducting layer. After that, a second interlayer insulating layer 215 is deposited to form a concave capacitor and a storage node hole is formed. A bottom electrode 220, a CVD-BST layer 225 and a top electrode 230 are consecutively formed on the storage node hole thereon. In FIG. 1, in the regions of A, B, C, D and E, electric characteristics are unstable and produce a high leakage current, etc., due to the composition difference between Ba+Sr and Ti in CVD-BST process. This problem is generated when a gas phase reaction in the CVD deposition process causes unstable surface reactions according to the topology. Since the BST capacitor has sensitive electric characteristics, the above-mentioned problem as a large effect on the reliability of the whole device.

SUMMARY OF THE INVENTION

It is, therefore, an object of the present invention to provide a method for manufacturing a memory device having a BST capacitor in a concave structure by using the atomic layer deposition (ALD) capable of providing a good step-coverage of a dielectric material therein and by using the chemical vapor deposition (CVD) method in forming other thick layers required to form the BST capacitor.

The invention, in part, pertains to a method for manufacturing a memory device having a dielectric layer, which includes forming a seed layer as a first dielectric layer by using a ALD method, and forming a second dielectric layer by using a CVD method. The first dielectric layer can be an ALD-BST layer, and the second dielectric layer can be a CVD-BST layer.

The invention, in part, pertains to a method for manufacturing a memory device which includes the steps of: forming a first interlayer insulating layer having a contact hole on a semiconductor substrate, forming a contact plug that is connected to the semiconductor substrate, forming a second interlayer insulating layer on the first interlayer insulating layer and the contact plug, forming a storage node hole by applying a selective etching process to the second interlayer insulating layer, thereby exposing the contact plug, forming a bottom electrode pattern on the exposed contact plug, successively forming an ALD-BST layer and a CVD-BST layer on the bottom electrode to form a dielectric layer, and depositing a top electrode on the dielectric layer. The first interlayer insulating layer includes oxide and nitride layers, and the nitride layer forms at a thickness of about 300 Å to about 1000 Å.

The invention, in part, pertains to the step of forming the contact plug, in which includes the steps of forming a contact hole by applying a selective etching process to the first interlayer insulating layer, filling the contact hole with a polysilicon layer and applying an etch back process to the polysilicon layer to form a recess, and filling the recess with a silicide or barrier metal layer. The polysilicon layer can be a doped polysilicon layer formed at a thickness of about 500 Å to about 3000 Å using chemical vapor deposition. The plug recess has a depth of about 500 Å to about 1500 Å. Also, the silicide layer is a $TiSi_x$ layer which is formed by forming a Ti layer on the plug recess at a thickness of about 100 Å to about 300 Å, applying a thermal treatment to the Ti layer, and removing a non-reaction Ti layer using a wet etching process. In the invention, the barrier metal layer can be any one of TiN, TiSiN, TaAlN and a mixed layer thereof, and the barrier metal layer is deposited by a PVD or CVD method. Also, filling the recess is performed by applying a planarization process to the barrier metal layer by a chemical mechanical polishing method.

The invention, in part, pertains to the second interlayer insulating layer being formed by successively depositing an etching barrier layer, an oxide layer and a reflection barrier layer. The etching barrier layer can be a SiON layer.

The invention, in part, pertains to the step of forming the bottom electrode pattern including forming a conductive layer on the resulting structure including the storage node hole, forming a sacrificial layer on the conductive layer within the storage node hole, removing a portion of the conductive layer and a portion of the sacrificial layer in order to separate the conductive layer into a plurality of bottom electrodes, and removing the remnant of the sacrificial layer. Also, the conductive layer may be any one of Ru, Pt, Ir, Os, W, Mo, Co, Ni, Au or Ag. The conductive layer is deposited by a CVD method and the conductive layer is formed at a thickness of about 50 Å to about 500 Å and at a substrate temperature of about 200° C. to about 500° C.

The invention, in part, pertains to the sacrificial layer being formed with a photoresist layer or an oxide layer. When the sacrificial layer is a photoresist layer, a portion of the sacrificial layer is removed by an ashing process after being separated into the bottom electrodes. When the sacrificial layer is an oxide layer, a portion of sacrificial layer is removed by a wet etching process after being separated into the bottom electrodes. Also, the ALD-BST layer is formed at a temperature of about 150° C. to about 300° C. and at a thickness of about 20 Å to about 100 Å. In the invention, after depositing the ALD-BST layer, a plasma thermal treatment is performed in an atmosphere comprising at least one of $N_2O$, $H_2$ or $O_2$ for about 30 to about 180 seconds and at a temperature of about 300° C. to about 400° C., and power is applied in a range of about 100 W to about 1 kW. Further, the CVD-BST layer can be deposited at a substrate temperature of about 400° C. to about 600° C. and at a thickness of 50 Å to 200 Å. After depositing the CVD-BST layer, a rapid thermal nitridation (RTN) is performed in an atmosphere of $N_2$ or $N_2O_2$ gas, and a thermal treatment is carried out for about 30 to about 180 seconds and at a temperature of about 500° C. to about 700° C. The top electrode is any of Ru, Pt, Ir, Os, W, Mo, Co, Ni, Au and Ag, and the top electrode is formed by a CVD method.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION OF THE PREFERRED EMBODIMENTS

Figure 1:
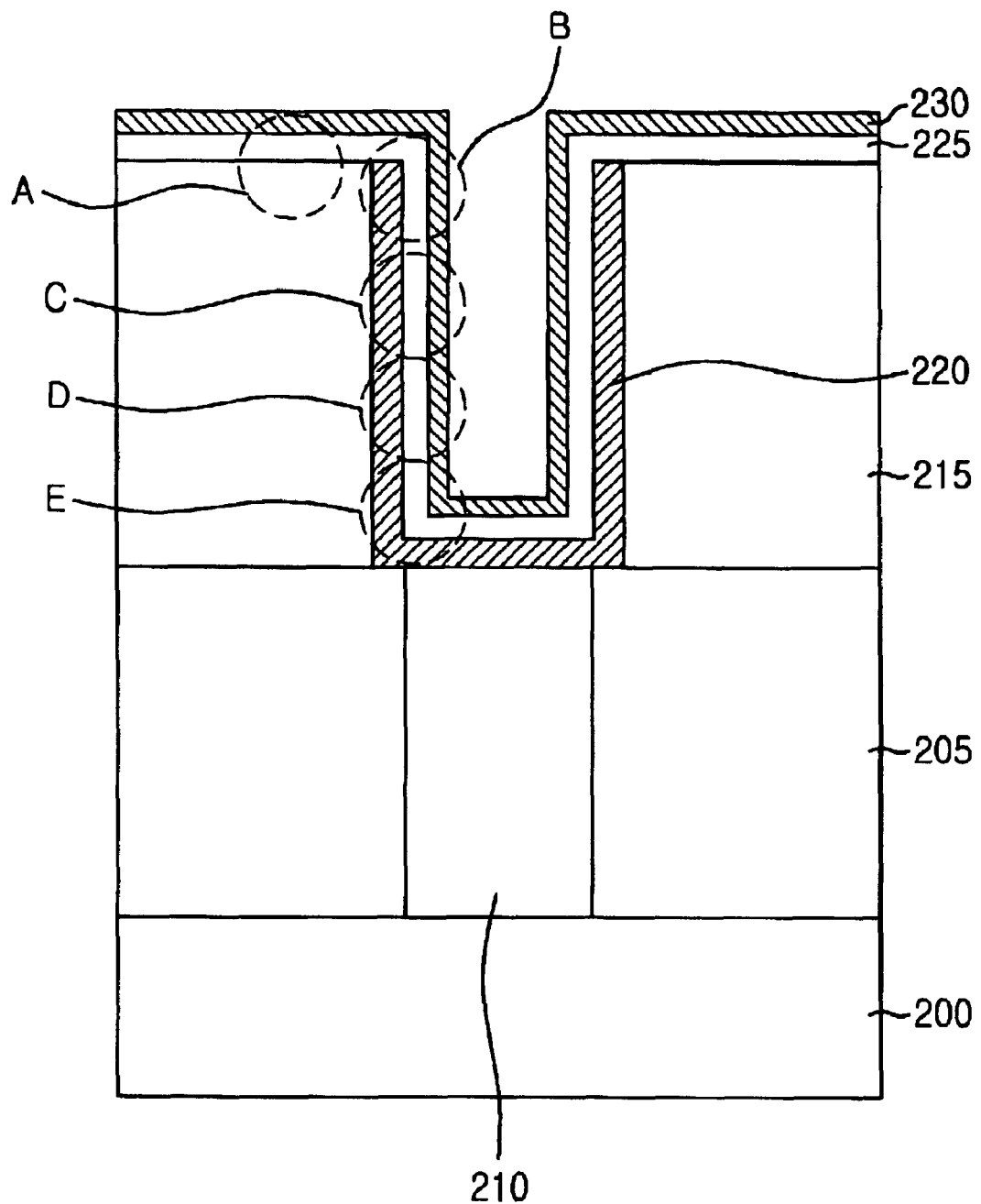
FIG. 1 is a cross-sectional view illustrating a conventional method for manufacturing a semiconductor device.

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

A $(BaSr)TiO_3$ (BST) layer, which is used as a dielectric material in the invention, is a crystal having a perovskite structure. The BST layer is deposited by using an atomic layer deposition (ALD) method (hereinafter, referred to as an ALD-BST) and then it is also deposited by using a chemical vapor deposition (CVD) method (hereinafter, referred to as a CVD-BST).

The ALD method is similar to a CVD method from the viewpoint of chemical reactions between precursors. However, they are different from each other in that the conventional CVD method uses reactions between the precursors in a vapor state, while the ALD method uses surface reactions between two precursors. In an ALD process, when a precursor is adsorbed in a surface of a substrate and then another precursor is supplied, these two precursors meet on the surface and react with each other, thereby forming a layer on the substrate. Therefore, the ALD reaction precursor itself dissociates at the reaction temperature, and a reaction between the adsorbed and the supplied precursors takes place on the surface of the substrate. As kinds of precursors, solid, liquid and vapor state precursors may be used, and a source vapor is supplied with a carrier gas, which can be at least one of $N_2$, Ar, etc.

The greatest advantage provided by an ALD process, which uses a surface reaction, is to obtain an equal thickness and good step coverage. When one kind of precursor vapor is provided and adsorbed at the surface, the precursor is absorbed at all sites where chemisorptions are possible. If an excess quantity is provided, then the excess does not contribute to the reaction. The residual vapor is removed by a purge gas. Then, another kind of precursor is supplied and adsorbed to the surface to make a reaction, so the layers are always grown in an equal speed. For example, in the ALD method using "A" and "B", one purge cycle, "A" supply->$N_2$ (or Ar) purge->"B" supply->$N_2$ (or Ar) purge, is repeated to grow layers, and the growth speed denotes a layer thickness deposited for the one cycle. The layer is deposited by the above-mentioned deposition process, so that all the exposed surface has a similar possibility of adsorption of the precursor molecules regardless of its roughness. If the supplied precursors are sufficient, the layer is deposited in the same speed, regardless of an aspect ratio of surface structure. Also, since the above-mentioned method uses a one-by-one stacking method, it is possible to regulate precise control in thickness and composition of the layer.

The ALD method, when comparing with CVD, has another advantage in that a more complicated three dimensional layer deposition is possible. In the CVD method, a layer composition is determined according to a thermal reaction of reagent gases, so a composition regulation thereof is not easy. On the other hand, the ALD method makes it possible to form a more complicated layer by alternating a plurality of atomic layers on a basis of the unit thickness of an atom.

In an embodiment of the invention, an ALD layer is deposited by using a mixture, i.e., a cocktail source of (Ba+Sr) and a Ti source. In the case of the cocktail source of (Ba+Sr), it is manufactured by mixing a mole fraction of 0.5:0.5 Ba:Sr in a solution, and the liquid concentration may be regulated to adapt a Ba:Sr:Ti composition of 0.25:0.25:0.5. A first cycle for depositing an ALD-BST layer uses $H_2O$ vapor is used as an $O_2$ source. The sequence for the first cycle is as follows: (Ba+Sr) cocktail source flow->$N_2$ (or Ar) purge->$H_2O$ vapor flow->$N_2$ or Ar) purge->Ti flow->$N_2$ (or Ar) purge->$H_2O$ vapor flow->$N_2$ (or Ar) purge.

As described above, if the first BST formation restricts a gas phase of CVD, then step coverage can be obtained in a storage node equally at a low temperature by using the ALD method. Then, the first BST layer is crystallized by plasma treatment using a low thermal budget. Finally a second BST layer is formed by using the CVD process for a post-layer process in a stacked layer. As a result, the boundary between the BST and a bottom electrode, which greatly affects the leakage current, may be effectively adjusted. Also, a BST seed layer deposited by the ALD method may decrease the thermal budget for a barrier metal to thereby manufacture a BST capacitor having good electric characteristics and reliability.

A method for manufacturing memory device according to a preferred embodiment of the invention will be described in detail referring to the accompanying drawings.

Figure 2:
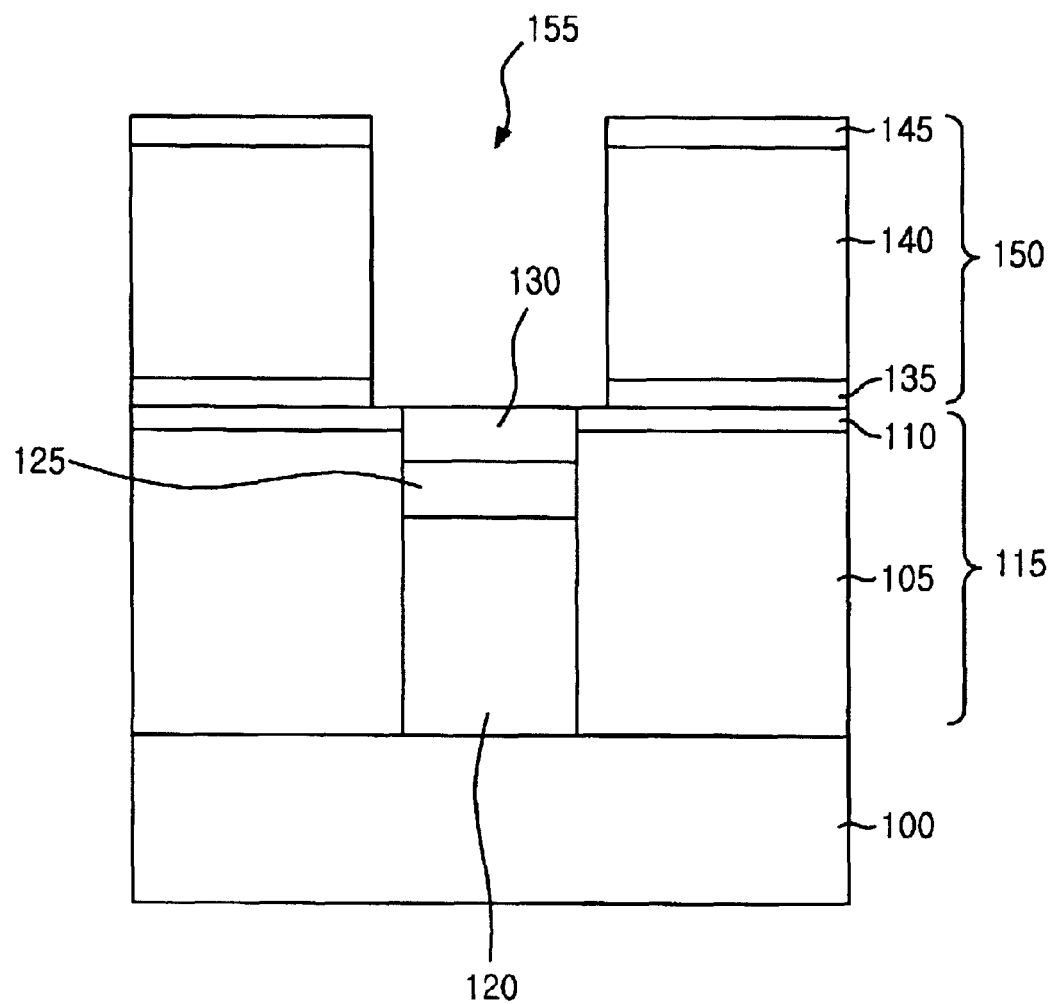
FIGS. 2 to 6 are cross-sectional views illustrating a method for manufacturing a semiconductor device in accordance with an embodiment of the present invention.

FIG. 2 is a cross-sectional view illustrating a method for manufacturing a semiconductor device in accordance with a preferred embodiment of the invention.

Referring to FIG. 2, a first interlayer insulating layer 115, which includes an oxide layer 105 and a nitride layer (SiON) 110 as an anti-reflection layer, is formed on a semiconductor substrate 100 at a thickness of about 300 Å to 1000 Å, and a storage contact hole is connected to an active region (not shown) of the semiconductor substrate 100 through the first interlayer insulating layer 115. A doped polysilicon layer is deposited on the storage contact hole at a thickness of about 500 Å to 3000 Å by using the CVD method. A surface of the first interlayer insulating layer 115 is exposed by etching back the doped polysilicon layer. At this time, the doped polysilicon layer undergoes an over etching process to form a polysilicon layer 120 only inside of a plug. Therefore, the contact hole is not completely filled with the polysilicon 120, and the polysilicon 120 is recessed to have an extra space on a top region thereof. The plug recess has a height of about 500 Å to 1500 Å.

After that, a cleaning process is performed, and a Ti layer is deposited at a thickness of about 100 Å to 300 Å on the resulting structure. Then, a thermal treatment is carried out by using a rapid thermal processing (RTP) method to form a $TiSi_x$ layer 125, then a non-active Ti layer is removed by a wet etching process. In this case, WN and W layers may be used to substitute for the Ti layer. This silicide layer 125 is formed to reduce contact resistance by forming ohmic contact with a polysilicon layer before forming a barrier metal.

After that, the barrier metal is deposited on the resulting structure of the substrate, and planarized by using a chemical mechanical polishing (CMP) method. In the case of high temperature treatment in an atmosphere of $O_2$ for a dielectric crystallization, a barrier metal is diffused and causes polysilicon oxidation in a surface of the polysilicon layer 120 for the plug and in an interface between the polysilicon layer 120 and a storage electrode. A barrier metal 130 can be any of TiN, TaN, TiSiN, TaSiN or TaAlN, and composite materials thereof, and a physical vapor deposition (PVD) or CVD can be used as a deposition method.

A second interlayer insulating layer 150 is formed to form a storage node of a concave capacitor. The second interlayer insulating layer 150 is composed of an etch stopper 135, an oxide layer 140 and an anti-reflection layer 145. A SiON layer is deposited as the etch stopper 135, and the oxide layer 140 and the anti-reflection layer 145 are deposited over the etch stopper, and then a storage node 155 are consecutively formed by carrying out a photo masking and an etching process.

Figure 3:
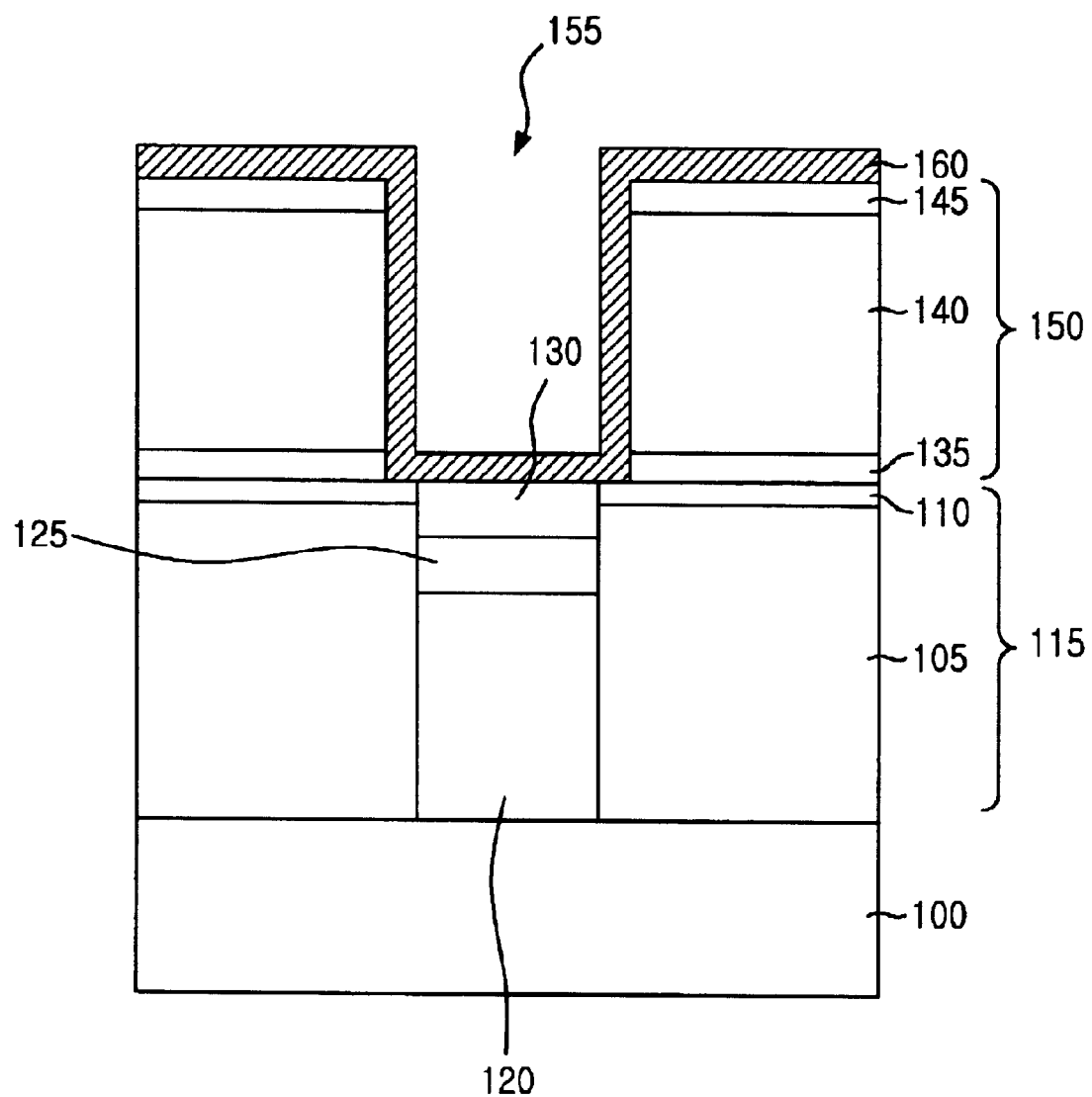

FIG. 3 is a cross-sectional view after depositing a conductive layer 160 for a bottom electrode. The conductive layer 160 is deposited using a CVD method. The conductive layer 160 can be any appropriate material such as at least one Ru, Pt, Ir, Os, W, Mo, Co, Ni, Au or Ag. The conductive layer 160 is formed at a thickness of about 50 Å to 500 Å and at a temperature of about 200° C. to 500° C.

Figure 4:
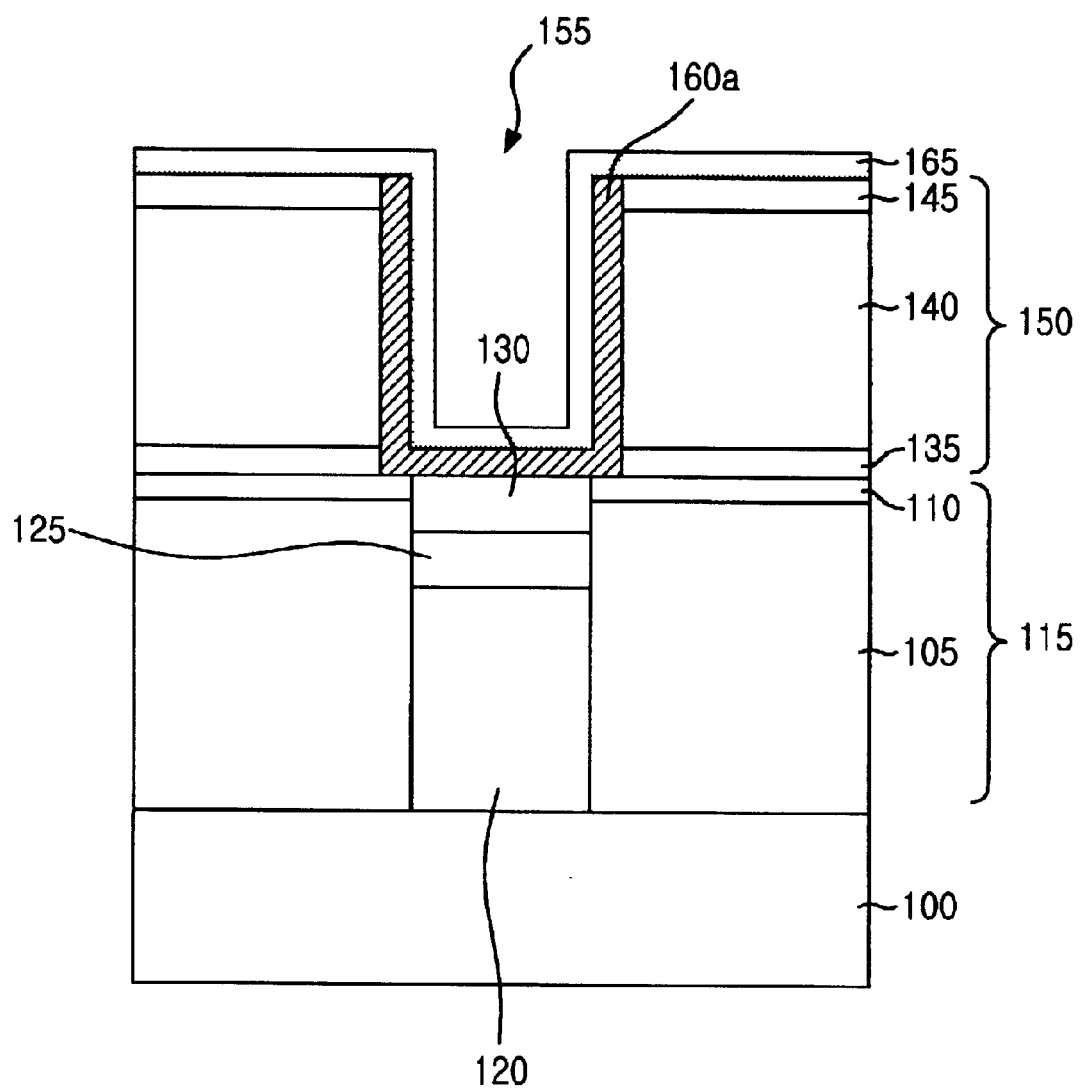

FIG. 4 is a cross-sectional view after forming a bottom electrode pattern 160a and an ALD-BST layer 165 with the storage node separation.

For separate a storage node, a sacrificial layer, which has enough thickness to fully fill the inside of the storage hole on a resulting material where the bottom electrode conductive layer, is deposited. The sacrificial layer may be formed with a photoresist layer or an oxide layer. Subsequently, a portion of the bottom electrode and the sacrificial layer are removed until a top portion of the interlayer insulating layer is exposed by using the etch back or the CMP method to separate the bottom electrode into a plurality of electrodes. At this time, a residual remnant of the sacrificial layer may still exist inside of the storage node hole, and on the bottom electrode. The residual remnant of the sacrificial layer is removed by using an ashing or a wet etching process. When the sacrificial layer is made of a photoresist layer, a portion of the sacrificial layer is removed by using the ashing process. If the sacrificial layer is made of an oxide layer, the portion of the sacrificial layer is removed by using a wet etching process. Next, a thin BST layer 165 is deposited at a low temperature by using an ALD depositing method, and then a plasma thermal treatment is performed. A first cycle for depositing the ALD-BST layer follows the following sequence.

(Ba+Sr) cocktail source flow->$N_2$ (or Ar) purge->$H_2O$ vapor flow->$N_2$ (or Ar) purge->Ti flow->$N_2$ (or Ar) purge->$H_2O$ vapor flow->$N_2$ (or Ar) purge.

At this time, the (Ba+Sr) cocktail source is methanol into which Ba(metmhd)2[Methoxy Ethoxy Tetramethyl Heptane Dionato Barium] and Sr(metmhd)2[Methoxy Ethoxy Tetramethyl Heptane Dionato Strontium] are dissolved. The Ti source includes a Ti alkoxide Ti(mpd) (tmhd)2[Methoxy Pentane Dioxy Tetamethyl Heptane Dionato Titanate]. Also, considering the boiling point of the Ti precursor, a deposition temperature is about 150° C. to 300° C. The deposition is carried out for about 20 to 100 cycles to adjust the thickness from about 20 Å to 100 Å. Each source, $H_2O$ and purge gas is modulated at flow rates of about 20 sccm to 80 sccm. A delivery time of (Ba+Sr) of the cocktail source is about 0.1 second to 1.0 second, the purge gas about 1.0 to 5.0 seconds and the $H_2O$ vapor about 0.1 to 1.0 seconds. In this case, the Ti flow rate is controlled between about 0.1 second to 1.0 second according to the Ti target composition. Also, the plasma thermal treatment is performed in a $N_2O$, $N_2$ or $O_2$ atmosphere to increase ALD-CVD crystallization in-situ or ex-situ. In this case, a temperature of the substrate is about 300° C. to 400° C., and power is applied for about 30 to 180 seconds in a range of about 100 W to 1 kW.

Figure 5:
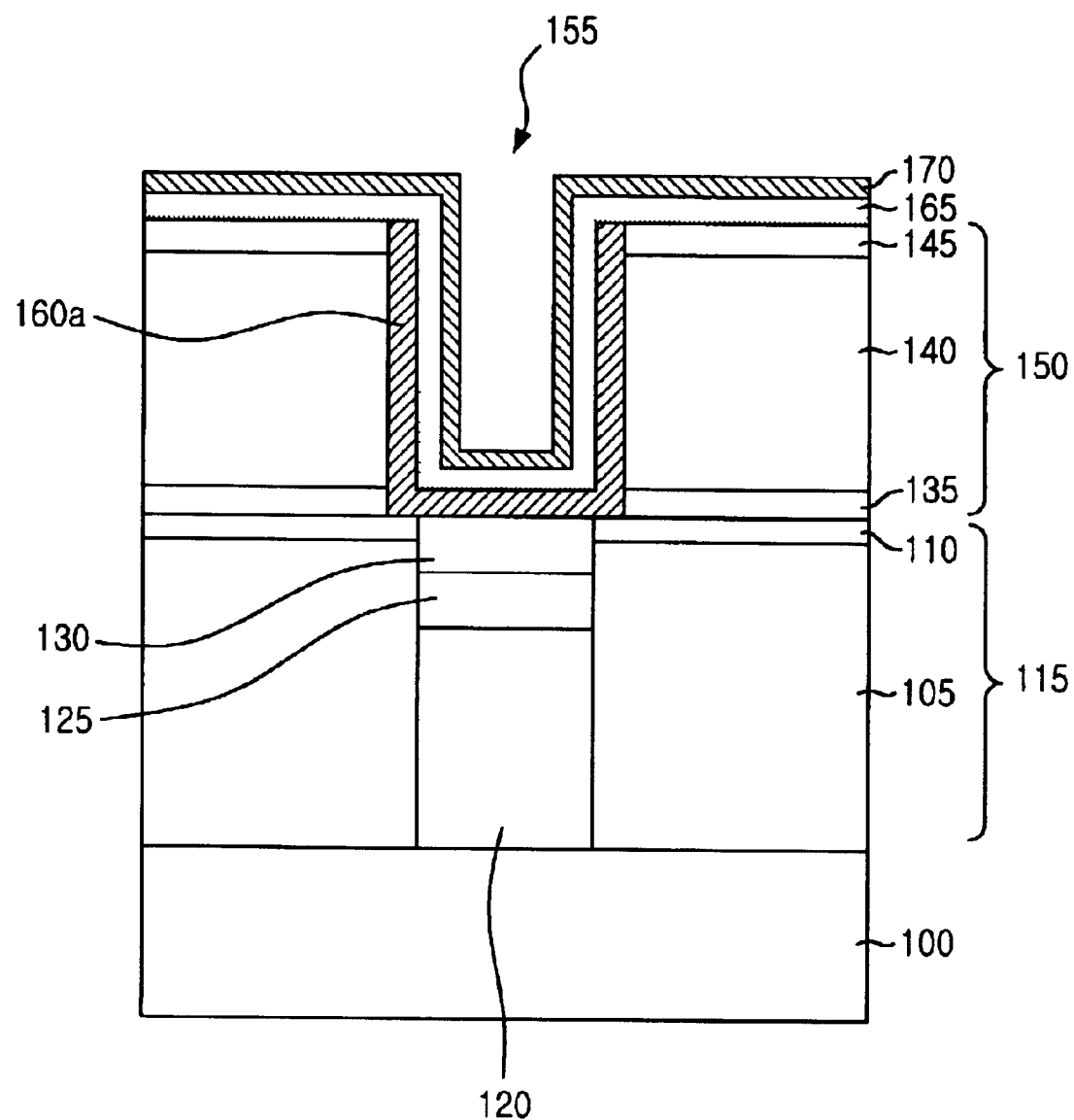

FIG. 5 is a cross-sectional view after forming a CVD-BST layer 170. The deposition of the CVD-BST 170 layer is carried out at a temperature of about 400° C. to 600° C., and to a thickness of about 50 Å to 200 Å. After depositing the CVD-BST layer 170 on the ALD-BST 165 which functions as a seed layer, a thermal treatment to crystallize a dielectric material is carried out. The thermal treatment is performed by a rapid thermal nitridation (RTN) method. This RTN is performed in a N₂ or N₂O₂ atmosphere for about 30 to 180 seconds and at a temperature of about 500° C. to 700° C.

Figure 6:
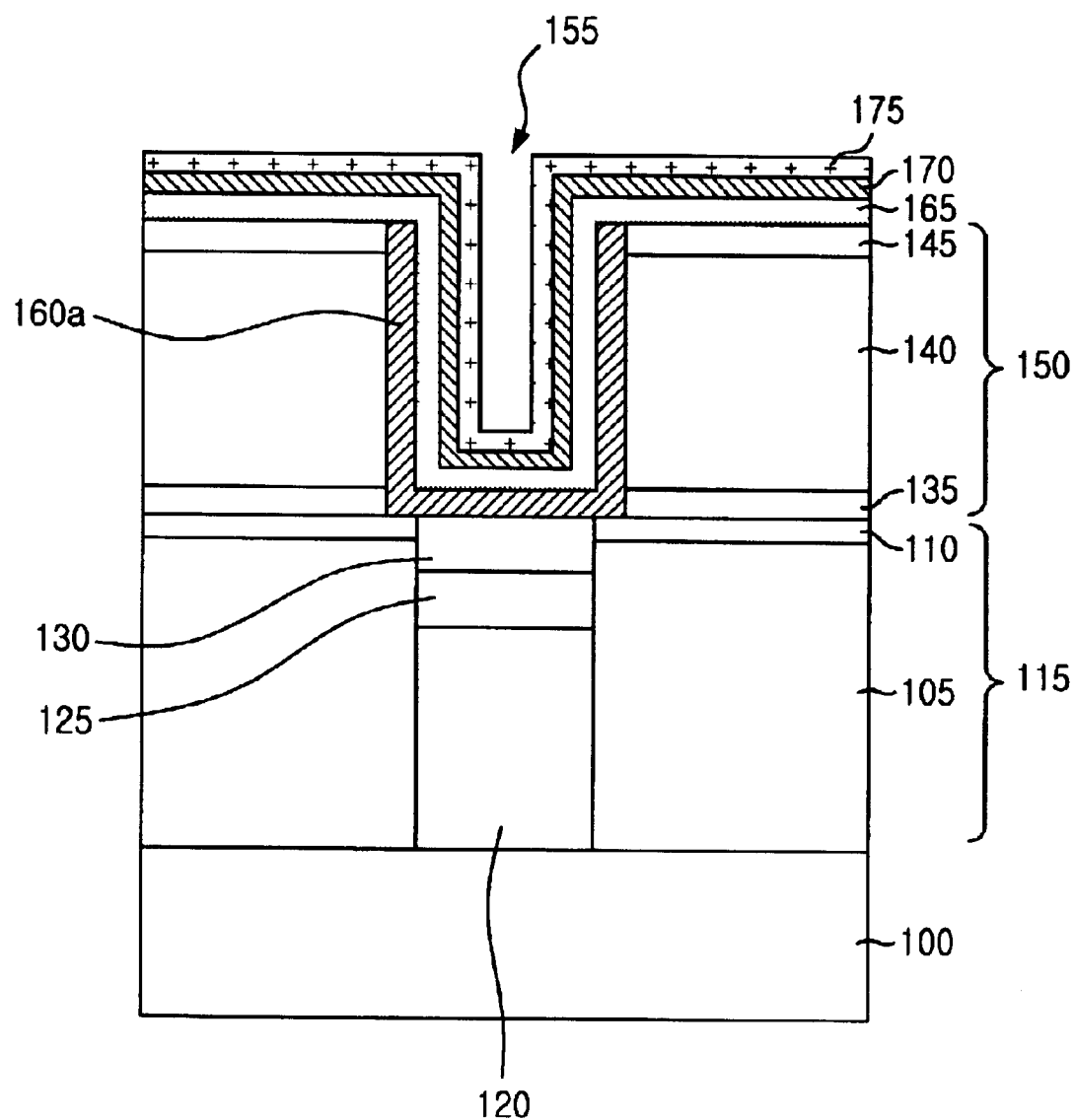

FIG. 6 is a cross-sectional view after depositing a top electrode 175. The top electrode 175 is formed a material that can be at least one of Ru, Pt, Ir, Os, W, Mo, Co, Ni, Au or Ag, and it is deposited by a CVD method.

The invention is applicable to a BST capacitor in a high integration DRAM or FRAM having high aspect ratio. The ALD-BST layer is used as a seed layer of CVD-BST in a deep hole of a storage node. Accordingly, the invention has good step coverage and improves crystallization and uniformity of the dielectric layer. Also, since the invention uses a low temperature deposition, the BST capacitor has low leakage current and high reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a memory device having a dielectric layer, comprising the steps of:
   a) forming a seed layer as a first dielectric layer by using an ALD method; and
   b) forming a second dielectric layer directly on the seed layer by using a CVD method, wherein the first dielectric layer is an ALD-BST layer and wherein the second dielectric layer is a CVD-BST layer.

2. A method for manufacturing a memory device comprising the steps of:
   a) forming a first interlayer insulating layer having a contact hole on a semiconductor substrate;
   b) forming a contact plug that is connected to the semiconductor substrate;
   c) forming a second interlayer insulating layer on the first interlayer insulating layer and the contact plug;
   d) forming a storage node hole by applying a selective etching process to the second interlayer insulating layer, thereby exposing the contact plug;
   e) forming a bottom electrode pattern on the exposed contact plug;
   f) successively forming an ALD-BST layer and a CVD-BST layer on the bottom electrode to form a dielectric layer; and
   g) depositing a top electrode on the dielectric layer.

3. The method of claim 2, wherein the first interlayer insulating layer includes oxide and nitride layers.

4. The method of claim 3, wherein the nitride layer has a thickness of about 300 Å to about 1000 Å.

5. The method of claim 2, wherein the step b) includes the steps of:
   b1) forming a contact hole by applying a selective etching process to the first interlayer insulating layer;
   b2) filling the contact hole with a polysilicon layer and applying an etch back process to the polysilicon layer to form a recess; and
   b3) filling the recess with a silicide or barrier metal layer.

6. The method of claim 5, wherein the polysilicon layer comprises a doped polysilicon layer formed at a thickness of about 500 Å to about 3000 Å using chemical vapor deposition.

7. The method of claim 5, wherein the plug recess has a depth of about 500 Å to about 1500 Å.

8. The method of claim 5, wherein the suicide layer is a TiSi$_x$ layer and wherein the step b3) includes the steps of:
   forming a Ti layer on the plug recess at a thickness of about 100 Å to about 300 Å;
   applying a thermal treatment to the Ti layer; and
   removing a non-reaction Ti layer using a wet etching process.

9. The method of claim 5, wherein the barrier metal layer is any material selected from the group consisting of TiN, TiSiN, TaAlN and a mixed layer thereof, and the barrier metal layer is deposited by a PVD or CVD method.

10. The method of claim 5, wherein the step b3) includes the step of applying a planarization process to the barrier metal layer by a chemical mechanical polishing method.

11. The method of claim 2, wherein the second interlayer insulating layer is formed by successively depositing an etching barrier layer, an oxide layer and a reflection barrier layer.

12. The method of claim 11, wherein the etching barrier layer is a SiON layer.

13. The method of claim 2, wherein the step e) includes the steps of:
   e1) forming a conductive layer on the resulting structure including the storage node hole;
   e2) forming a sacrificial layer on the conductive layer within the storage node hole;
   e3) removing a portion of the conductive layer and a portion of the sacrificial layer in order to separate the conductive layer into a plurality of bottom electrodes; and
   e4) removing the remnant of the sacrificial layer.

14. The method of claim 13, wherein the conductive layer comprises any material selected from the group consisting of Ru, Pt, Ir, Os, W, Mo, Co, Ni, Au and Ag, the conductive layer is deposited by a CVD method and the conductive layer is formed at a thickness of about 50 Å to about 500 Å and at a substrate temperature of about 200° C. to about 500° C.

15. The method of claim 13, wherein the sacrificial layer is formed with a photoresist layer or an oxide layer.

16. The method of claim 15, wherein the sacrificial layer is a photoresist layer, and a portion of the sacrificial layer is removed by an ashing process after being separated into the bottom electrodes.

17. The method of 15, wherein the sacrificial layer is an oxide layer, and a portion of the sacrificial layer is removed by a wet etching process after being separated into the bottom electrodes.

18. The method of claim 2, wherein the ALD-BST layer is formed at a temperature of about 150° C. to about 300° C. and at a thickness of about 20 Å to about 100 Å.

19. The method of claim 18, wherein, after depositing the ALD-BST layer, a plasma thermal treatment is performed in an atmosphere comprising at least one material selected from the group consisting of N₂O, H₂ and O₂ for about 30 to about 180 seconds and at a temperature of about 300° C. to about 400° C. and power is applied in a range of about 100 W to about 1 kW.

20. The method of claim 2, wherein the CVD-BST layer is deposited at a substrate temperature of about 400° C. to about 600° C. and at a thickness of about 50Å to about 200 Å.

21. The method of claim 20, wherein, after depositing the CVD-BST layer, a rapid thermal nitridation (RTN) is performed in an atmosphere of N₂ or N₂O₂ gas and a thermal treatment is carried out for about 30 to about 180 seconds and at a temperature of about 500° C. to about 700° C.

22. The method of claim 2, wherein the top electrode is any material selected from the group consisting of Ru, Pt, Ir, Os, W, Mo, Go, Ni, Au and Ag, and the top electrode is formed by a CVD method.

* * * * *